United States Patent
Park

(10) Patent No.: US 9,478,618 B1
(45) Date of Patent: Oct. 25, 2016

(54) SEMICONDUCTOR DEVICES AND METHODS OF FABRICATING THE SAME

(71) Applicant: SK hynix Inc., Gyeonggi-do (KR)

(72) Inventor: Jun Taek Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/081,258

(22) Filed: Mar. 25, 2016

(30) Foreign Application Priority Data

Nov. 4, 2015 (KR) .......................... 10-2015-0154451

(51) Int. Cl.
| | |
|---|---|
| H01L 21/8234 | (2006.01) |
| H01L 29/10 | (2006.01) |
| H01L 29/66 | (2006.01) |
| H01L 29/78 | (2006.01) |
| H01L 29/423 | (2006.01) |

(52) U.S. Cl.
CPC ... *H01L 29/1083* (2013.01); *H01L 21/823431* (2013.01); *H01L 29/42376* (2013.01); *H01L 29/66795* (2013.01); *H01L 29/7853* (2013.01)

(58) Field of Classification Search
CPC ... H01L 21/64; H01L 21/70; H01L 21/8232; H01L 29/66007
See application file for complete search history.

(56) References Cited

U.S. PATENT DOCUMENTS

2007/0057325 A1* 3/2007 Hsu .................. H01L 29/785
257/347
2015/0028426 A1 1/2015 Ching et al.

\* cited by examiner

*Primary Examiner* — Cheung Lee
(74) *Attorney, Agent, or Firm* — IP & T Group LLP

(57) ABSTRACT

A semiconductor device includes a fin-shaped active region protruding from a surface of a base substrate. The fin-shaped active region includes a first impurity region and a second impurity region spaced apart from each other along a first direction and a channel region disposed between the first and second impurity regions. A trench is provided in the base substrate under the channel region. The trench extends in a second direction to intersect the fin-shaped active region in a plan view. A blocking layer fills the trench to overlap with the channel region of the fin-shaped active region. A gate is disposed to overlap with blocking layer and the channel region.

20 Claims, 17 Drawing Sheets

THIRD DIRECTION
SECOND DIRECTION
FIRST DIRECTION

SEMICONDUCTOR DEVICES AND METHODS OF FABRICATING THE SAME

CROSS-REFERENCE TO RELATED APPLICATIONS

The present application claims priority under 35 U.S.C 119(a) to Korean Patent Application No. 10-2015-0154451, filed on Nov. 4, 2015, which is herein incorporated by reference in its entirety.

BACKGROUND

1. Technical Field

Various embodiments of the present disclosure relate generally to semiconductor devices and, more particularly, to semiconductor devices including fin-type field effect transistors and methods of fabricating the same.

2. Related Art

The semiconductor industry has developed highly integrated semiconductor devices. Various technologies that reduce the minimum feature size (MFS) have been developed for increasing the integration density of semiconductor devices including transistors such as MOS transistors. However, reducing the MFS, may increase a leakage current due to a short channel effect of the MOS transistors, even when the MOS transistors are turned off. Accordingly, a lot of effort is now focused on suppressing the short channel effect of the MOS transistors.

A fin-type field effect transistor (finFET) has been proposed for improving the integration density of the semiconductor devices while at the same time suppressing the short channel effect. A finFET may have a fin-shaped active region protruding from a surface of a semiconductor substrate, and thus, may have an increased channel width in a limited planar area. Generally, a finFET may be more effective in suppressing the short channel effect than a planar MOS transistor, however, further improvements are desirable.

SUMMARY

Various embodiments of the present disclosure are directed to semiconductor devices including finFETs and methods of fabricating the same.

According to an embodiment, a semiconductor device includes a fin-shaped active region protruding from a surface of a base substrate. The fin-shaped active region includes a first impurity region and a second impurity region spaced apart from each other along a first direction and a channel region disposed between the first and second impurity regions. A trench is provided in the base substrate under the channel region. The trench extends in a second direction to intersect the fin-shaped active region in a plan view. A blocking layer fills the trench to overlap with the channel region of the fin-shaped active region. A gate is disposed to overlap with blocking layer and the channel region.

According to another embodiment, there is provided a method of fabricating a semiconductor device. The method includes forming a trench in a base substrate. The trench is formed to extend in one direction along a surface of the base substrate. The trench is filled with an insulation layer to form a blocking layer in the trench. A semiconductor layer is formed on the blocking layer and the base substrate. The semiconductor layer is patterned to form a fin-shaped active region that protrudes from the surface of the base substrate and Intersects the blocking layer to overlap with a portion of the blocking layer. A first impurity region and a second impurity region is formed in the fin-shaped active region to be spaced apart from each other. The fin-shaped active region between the first and second impurity regions is defined as a channel region. A gate is formed to overlap with the blocking layer and the channel region and to intersect the fin-shaped active region.

BRIEF DESCRIPTION OF THE DRAWINGS

Various embodiments of the present disclosure will become more apparent in view of the attached drawings and accompanying detailed description, in which.

DESCRIPTION OF SPECIFIC EMBODIMENTS

Figure 1:
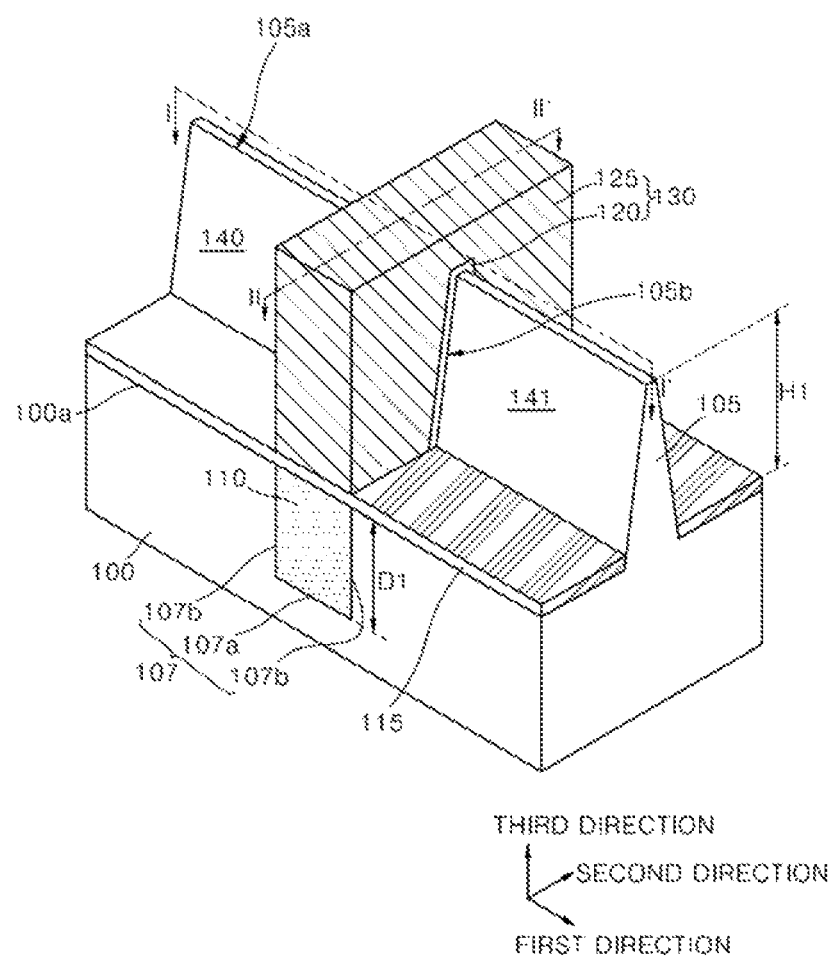
FIG. 1 is a perspective view illustrating a semiconductor device, according to an embodiment of the present disclosure.

Various embodiments of the present disclosure will be described hereinafter with reference to the accompanying drawings. However, the embodiments described herein are for illustrative purposes only and are not intended to limit the scope of the present disclosure.

Same reference numerals refer to same elements throughout the specification. Thus, even though a reference numeral is mentioned or described with reference to a drawing, the reference numeral may also be mentioned or described with reference to another drawing. In addition, even though a reference numeral is not shown in a drawing, it may be mentioned or described with reference to another drawing.

Referring to FIGS. 1, 2, 3A and 3B, a semiconductor device according to an embodiment of the present disclosure may be configured to include a fin-shaped active region 105, a blocking layer 110, a passivation layer 115 and a gate 130.

The fin-shaped active region 105 may protrude from a first surface 100a of a base substrate 100 by a preset height H1. The fin-shaped active region 105 may include a first impurity region 140, a second impurity region 141, and a channel region 145 (shown in FIG. 2). The first and second impurity regions 140 and 141 may be disposed in the fin-shaped active region 105 and spaced apart from each other by a preset distance. The first and second impurity regions 140 and 141 may correspond to a source region and a drain region, respectively. The channel region 145 may be disposed between the first and second impurity regions 140 and 141.

The base substrate 100 may be a silicon substrate. The fin-shaped active region 105 and the base substrate 100 may constitute a single unified body without any heterogeneous junction therebetween. The fin-shaped active region 105 may extend in a first direction to have an elongated, linear shape in a plan view. The fin-shaped active region 105 may have a width in a second direction intersecting the first direction at a right angle. A plane defined by a first axis parallel with the first direction and a second axis parallel with the second direction may be parallel with the first surface 100a of the base substrate 100. Moreover, the fin-shaped active region 105 may protrude from the base substrate 100 in a third direction perpendicular to the first and second directions. The preset height H1 of the fin-shaped active region 105 may vary according to a width of the channel region 145.

A lower width of the fin-shaped active region 105 may be greater than an upper width of the fin-shaped active region 105. For example, a width of the fin-shaped active region 105 may gradually increase toward the base substrate 100. Accordingly, a vertical cross-sectional view of the fin-shaped active region 105 taken along a line II-II' of FIG. 1 may have a trapezoid shape. In the embodiment shown in FIG. 1, a vertical cross-sectional view of the fin-shaped active region 105 taken along a line II-II' of FIG. 1 has an isosceles trapezoid shape.

A trench 107 may be provided in the base substrate 100 having a preset depth D1 measured from the first surface 100a (shown in FIG. 3B) of the base substrate 100. The blocking layer 110 may be disposed to fill the trench 107. The trench 107 may be defined by a bottom surface 107a and two sidewalls 107b. The bottom surface 107a of the trench 107 may be located at a level lower than the first surface 100a of the base substrate 100. The trench 107 may be disposed under the channel region 145. The trench 107 may extend in a second direction under the channel region 145 beyond both sides of the channel region to have a width that is greater than the width of the base of the fin shaped active region 105. The trench 107 may extend under the channel region on both sides of the fin-shaped active region 105 in the second direction in a plan view. In some embodiments, the trench 107 may extend in the second direction to have an elongated, linear shape in a plan view. The trench 107 may overlap with a portion of the fin-shaped active region 105 to intersect the fin-shaped active region 105.

Figure 6:
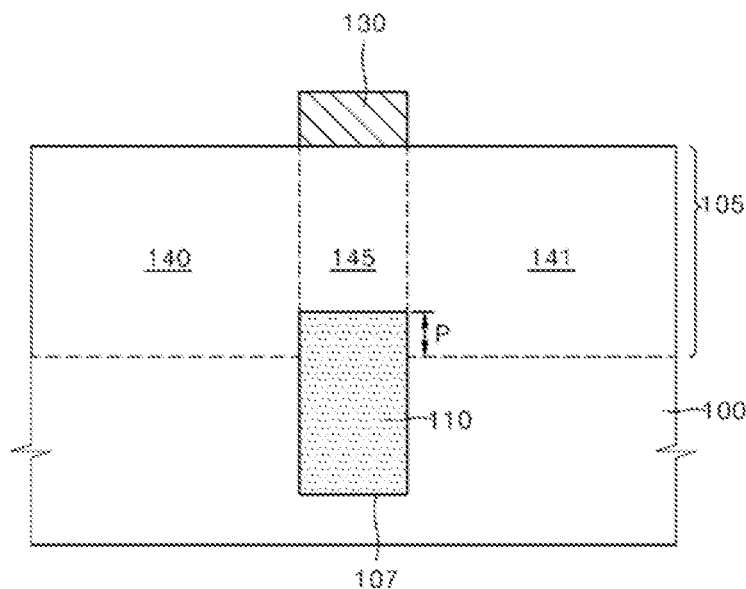
FIG. 6 is a cross-sectional view illustrating a semiconductor device, according to another embodiment of the present disclosure.

The trench 107 may be filled with the blocking layer 110. Accordingly, the blocking layer 110 may have the same shape as the trench 107. The blocking layer 110 may be disposed under the channel region 145 of the fin-shaped active region 105 and may extend on both sides of the fin shaped active region 105 in the second direction. Hence, the blocking layer 110 may intersect the fin-shaped active region 105 in the second direction in a plan view. The blocking layer 110 may overlap with a portion of the fin-shaped active region 105. The blocking layer 110 may extend in the second direction to have an elongated, linear shape intersecting the fin-shaped active region 105. In some embodiments, a top surface of the blocking layer 110 may be coplanar with the first surface 100a of the base substrate 100. Alternatively, the blocking layer 110 may protrude from the first surface 100a of the base substrate 100 by a preset height P so that the top surface of the blocking layer 110 may be located at a level higher than the first surface 100a (corresponding to bottom surfaces of the first and second impurity regions 140 and 141) of the base substrate 100 (see FIG. 6). The blocking layer 110 filling the trench 107 may include an insulation layer, for example, an oxide layer.

Figure 2:
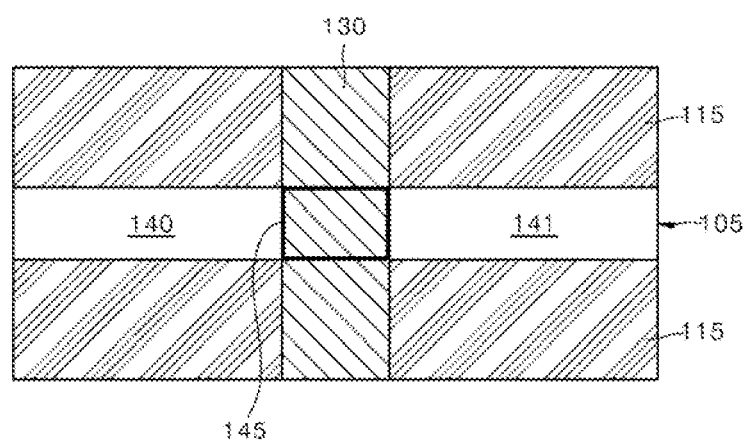
FIG. 2 is a top plan view of the semiconductor device shown in FIG. 1.
Figure 3A:
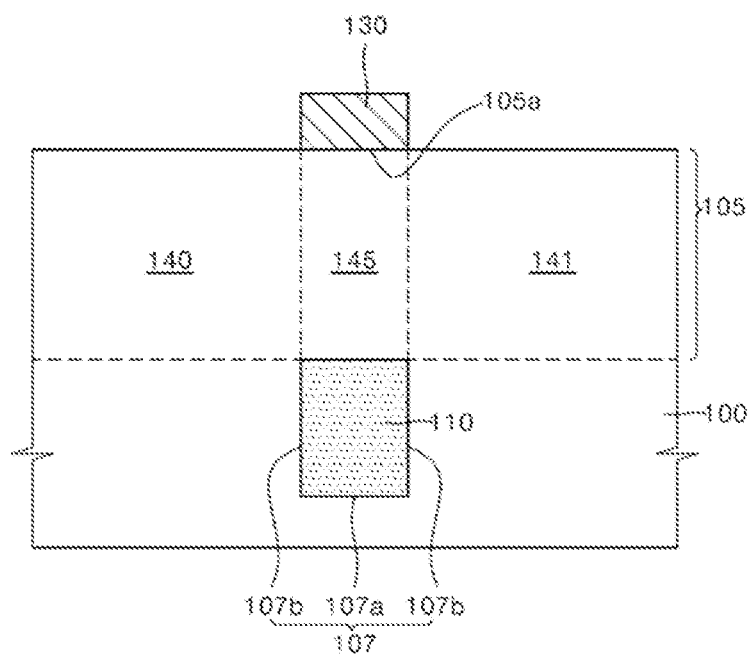
FIG. 3A is a cross-sectional view taken along a line I-I' of FIG. 1.
Figure 3B:
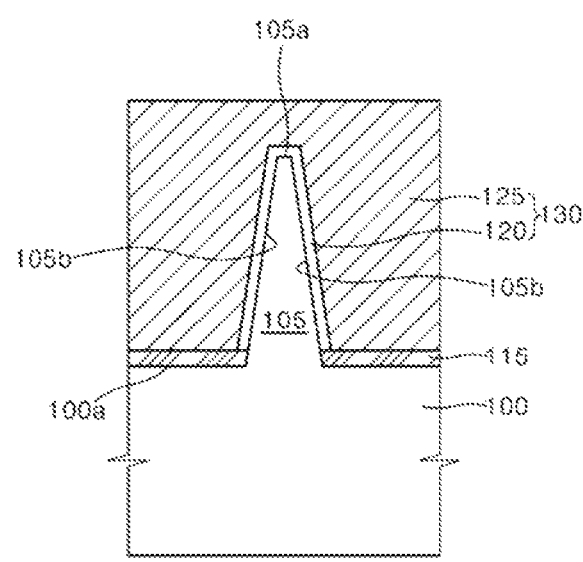
FIG. 3B is a cross-sectional view taken along a line II-II' of FIG. 1.

The gate 130 may be disposed on top of the blocking layer 110. Referring again to FIGS. 1 and 2, the gate 130 may extend in the second direction to cross over the fin-shaped active region 105. The gate 130 may be disposed to overlap with the blocking layer 110 and the channel region 145. Thus, the gate 130 and the fin-shaped active region 105 may intersect each other at a right angle, as illustrated in FIG. 2.

The gate 130 may be disposed to cross over the fin-shaped active region 105. Accordingly, the gate 130 may be disposed to surround both sidewalls and a top surface of the channel region 145. The gate 130 may include a gate electrode 125 comprised of a conductive layer such as a metal layer. In addition, the gate 130 may further include a gate insulation layer 120 disposed between the gate electrode 125 and the fin-shaped active region 105. The passivation layer 115 may be disposed on the first surface 110a of the base substrate 100 to prevent the gate electrode 125 from directly contacting the base substrate 100. For example, the passivation layer 115 may be disposed between the gate electrode 125 and the blocking layer 110. The passivation layer 115 may include an insulation layer, for example, an oxide layer.

Figure 4:
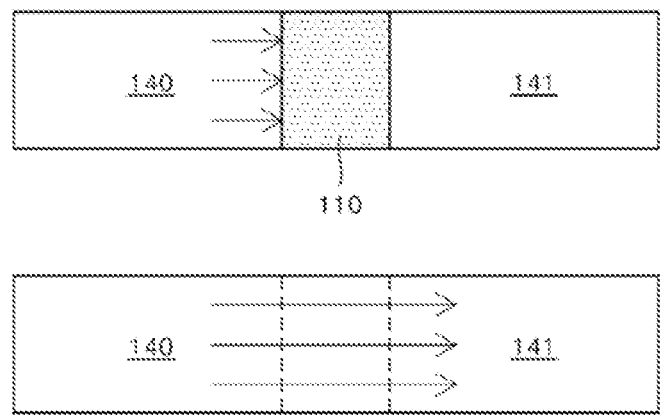
FIGS. 4, 5A and 5B illustrate leakage currents flowing in various semiconductor devices.

Referring to FIG. 4, a bottom surface of a channel region of a conventional finFET may be in direct contact with a silicon substrate corresponding to the base substrate 100, as illustrated in FIG. 4(a). In such a case, when the conventional finFET is turned off, carriers (e.g., electrons) may be drifted through the base substrate under the channel region to cause a leakage current between a source region 140 and a drain region 141 (see arrows in FIG. 4(a)). In particular, an amount of the leakage current may increase if a lower width of the fin-shaped active region is greater than an upper width of the fin-shaped active region of the conventional finFET. Generally, if a channel leakage current flows while a finFET is turned off, a switching characteristic of the finFET may be degraded to cause malfunction of a semiconductor device including the finFET.

According to an embodiment of the present disclosure, the semiconductor device (i.e., a finFET) may include the blocking layer 110 comprised of an insulation layer that is disposed under the channel region 145 of the fin-shaped active region 105. In such a case, the blocking layer 110 may block a channel leakage current when the finFET is turned off, as indicated by arrows in FIG. 4(b). Moreover, even though a lower width of the fin-shaped active region 105 is greater than an upper width of the fin-shaped active region 105, a leakage current between the first and second impurity regions 140 and 141 may be remarkably reduced because of the presence of the blocking layer 110 having the same width as the lower portion of the fin-shaped active region 105. As illustrated in FIG. 1, if the blocking layer 110 extends in the second direction to fully intersect the fin-shaped active region 105, the leakage current may be reduced even more effectively.

Figure 5A:
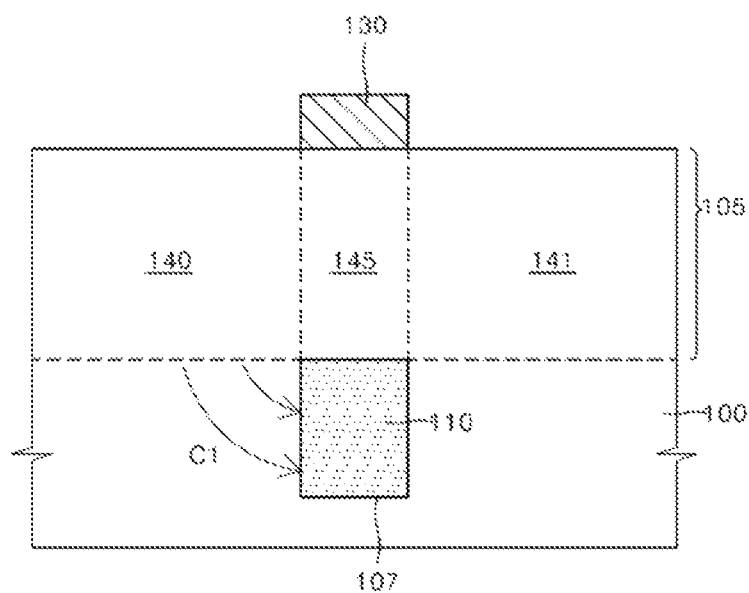
Figure 5B:
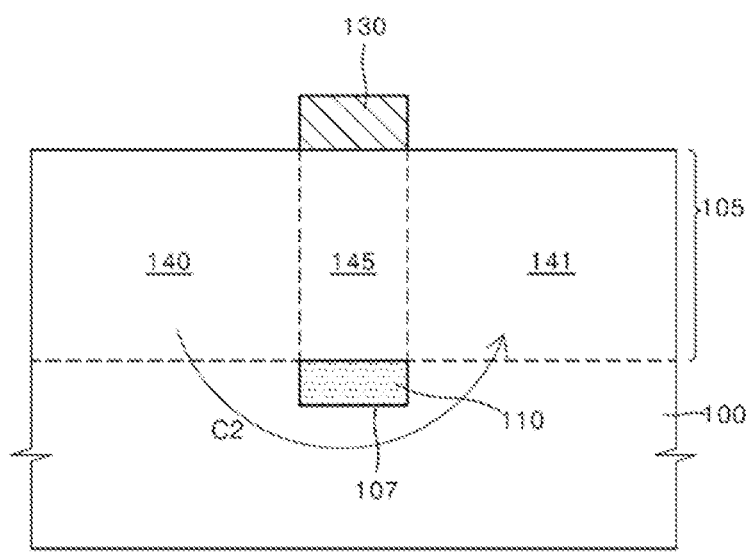

The degree of reduction and or complete blocking or elimination of the leakage current may depend upon the thickness of the blocking layer 110, i.e., its height in the third direction, referred to hereinafter also as the vertical thickness of the blocking layer. Generally, increasing the vertical thickness of the blocking layer 110 may reduce the leakage current flowing along a bottom surface of the blocking layer 110. Further, it has been found, that the leakage current may also depend on an aspect ratio of the blocking layer 110. The aspect ratio of the blocking layer 110 may be defined as a ratio of a vertical thickness of the blocking layer 110 to a horizontal width of the blocking layer 110. For example, as illustrated in FIG. 5B, if a vertical thickness of the blocking layer 110 is less than a horizontal width of the blocking layer 110, the aspect ratio of the blocking layer 110 may be less than one. In such a case, it has been found that when the semiconductor device (i.e., the finFET) is turned off, carriers (e.g., electrons) may be drifted from the first impurity region 140 toward the second impurity region 141 via the base substrate 100 under the blocking layer 110, as indicated by arrows C2 of FIG. 5B. As a result, a leakage current may still flow between the first and second impurity regions 140 and 141. Accordingly, preferably, the aspect ratio of the blocking layer 110 may be greater than one, as illustrated in FIG. 5A. In such a case, no carriers may be drifted from the first impurity region 140 toward the second impurity region 141 due to the presence of the blocking layer 110, as indicated by arrows C1 of FIG. 5A. Hence, preferably, the blocking layer 110 may have an aspect ratio of one or more to more effectively block the leakage current.

As described above, generation of the leakage current may be substantially suppressed or completely blocked by positioning a blocking layer 110 under the channel region 145 and by controlling the thickness and/or aspect ratio of the blocking layer 110.

The base substrate 100 under the first and second impurity regions 140 and 141 corresponding to a source and drain regions may be comprised of a silicon material. Thus, even though the finFET may generate heat, the generated heat in the finFET may be efficiently emitted through the base substrate 100.

Figure 7:
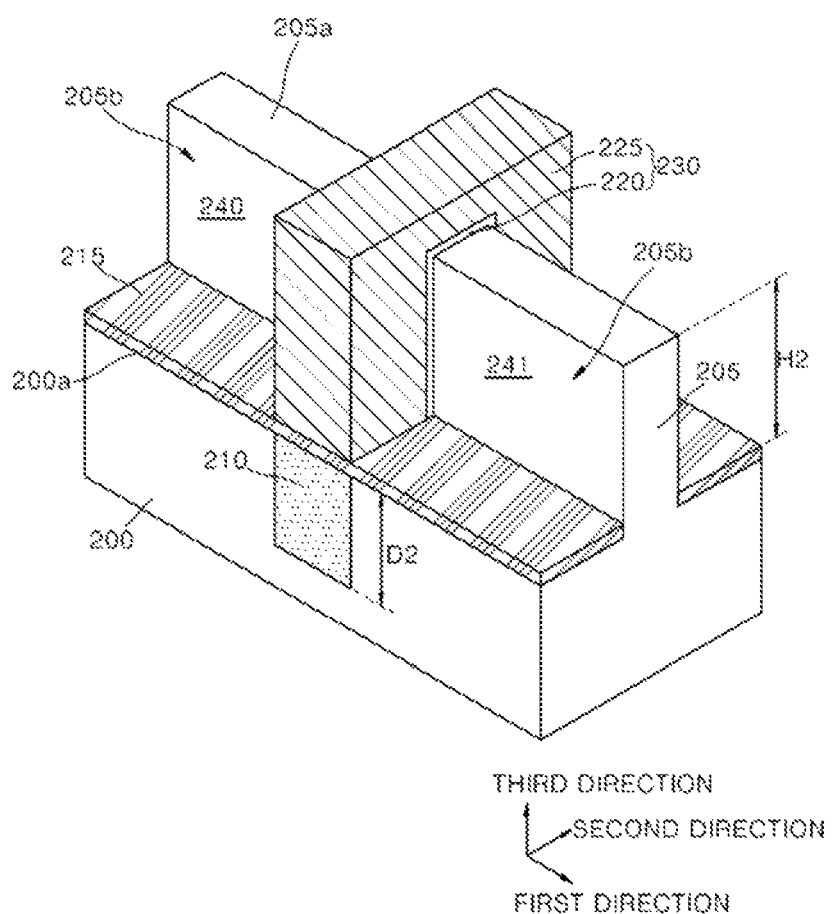
FIG. 7 is a perspective view illustrating a semiconductor device, according to yet another embodiment of the present disclosure.

FIG. 7 is a perspective view illustrating a semiconductor device according to yet another embodiment of the present disclosure.

Referring to FIG. 7, a fin-shaped active region 205 may be disposed to protrude from a first surface 200a of a base substrate 200 by a preset height H2. The fin-shaped active region 205 may extend in a first direction to have an elongated, linear shape in a plan view. The fin-shaped active region 205 may have a width in a second direction intersecting the first direction at a right angle. A plane defined by a first axis parallel with the first direction and a second axis parallel with the second direction may be parallel with the first surface 200a of the base substrate 200. Moreover, the fin-shaped active region 205 may protrude from the base substrate 200 in a third direction perpendicular to the first and second directions. A width of the fin-shaped active region 205 may be uniform so that an upper width of the fin-shaped active region 205 may be substantially equal to a lower width of the fin-shaped active region 205. Thus, a vertical cross-sectional view of the fin-shaped active region 205 taken along the second direction may have a rectangular shape. The fin-shaped active region 205 has a top surface 205a and side surfaces 205b. A first impurity region 240 and a second impurity region 241 may be disposed in the fin-shaped active region 205 and may be spaced apart from each other by an intermediate channel region (not shown). Hence, the channel region may be disposed in the fin-shaped active region 205 to separate the first and second impurity regions 240 and 241 from each other. The first and second impurity regions 240 and 241 may act as a source region and a drain region, respectively.

A blocking layer 210 may be disposed in the base substrate 200. The blocking layer 210 may extend in the second direction to have an elongated or linear shape in a plan view. The blocking layer 210 may be disposed under the channel region and may extend in the second direction on both sides of the fin-shaped active region. For example, the blocking layer 210 may overlap with the channel region and may extend under the channel region in the second direction to have an elongated or linear shape intersecting the fin-shaped active region 205. The blocking layer 210 may include an insulation layer, for example, an oxide layer.

A gate 230 may be disposed to surround a part of the top surface 205a and a part of the side surfaces 205b of the fin-shaped active region 205. For example, the gate 230 may overlap with the channel region and may extend over the blocking layer 210 in the second direction to have an elongated or linear shape intersecting the fin-shaped active region 205. The gate 230 may have an arch shape crossing over the channel region of the fin-shaped active region 205. Hence the gate may overlap the channel region. Thus, the first and second impurity regions 240 and 241 may be located at both sides of the gate 230 in the first direction, respectively. The gate 230 may include a gate electrode 225 and a gate insulation layer 220 disposed between the gate electrode 225 and the channel region. A passivation layer 215 may be disposed between the gate 230 and the blocking layer 210 to prevent the gate electrode 225 from contacting the base substrate 200. The passivation layer 215 may extend onto the first surface 200a of the base substrate 200 both in the first and second directions other than a base area of the fin-shaped active region.

FIGS. 8 to 15 are perspective views illustrating a method of fabricating a semiconductor device according to an embodiment of the present disclosure.

Figure 8:
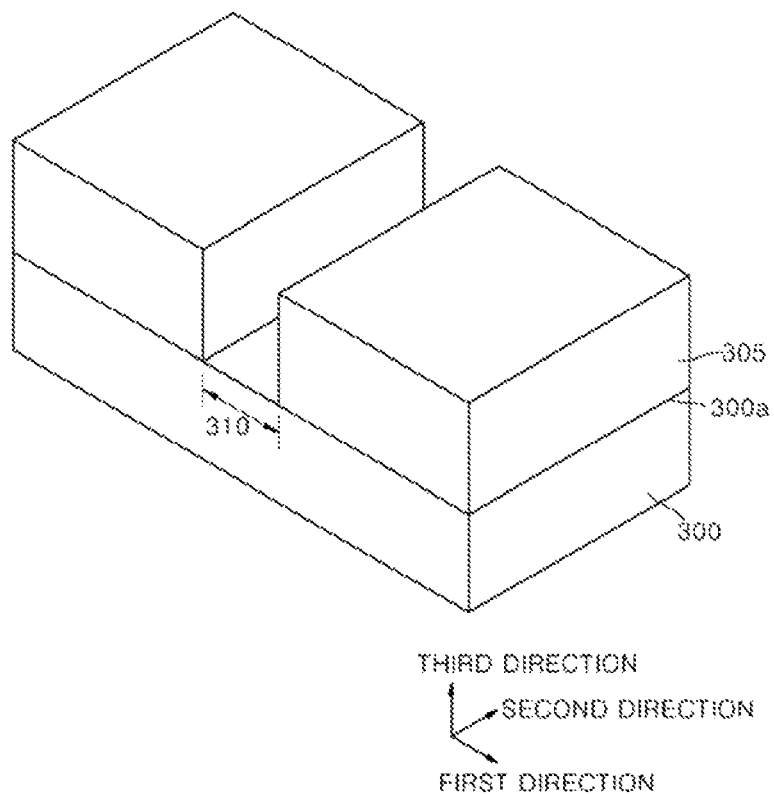
FIGS. 8 to 15 are perspective views illustrating a method of fabricating a semiconductor device, according to an embodiment of the present disclosure.

Referring to FIG. 8, a hard mask pattern 305 may be formed on a base substrate 300. The base substrate 300 may be a silicon substrate. The hard mask pattern 305 may be formed to have an opening 310 exposing a portion of a first surface 300a of the base substrate 300. The opening 310 may be formed to have an elongated or linear shape extending in a second direction. A plane defined by a first axis parallel with the first direction and a second axis parallel with the second direction may be parallel with the first surface 300a of the base substrate 300. Although FIG. 8 illustrates an example in which the hard mask pattern 305 is formed to include a single opening 310, the present disclosure is not limited thereto. For example, in some embodiments, the hard mask pattern 305 may be formed to include a plurality of openings which are spaced apart from each other. The plurality of openings may be spaced apart at regular intervals along a first direction. Each opening may have an elongated or linear shape extending in the second direction. The first and second directions may be perpendicular to one another as shown in the embodiment of FIG. 8

Figure 9:
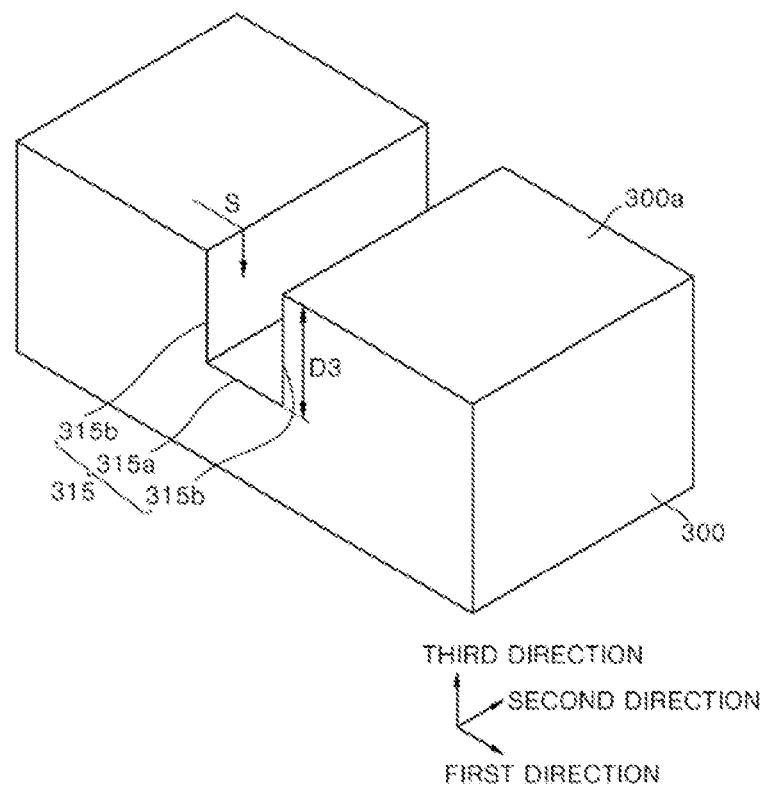

Referring to FIG. 9, a trench 315 may be formed in the base substrate 300. The trench 315 may be formed by etching the base substrate 300 using the hard mask pattern 305 as an etch mask. The trench 315 may be defined by a bottom surface 315a located at a lower level than the first surface 300a of the base substrate 300 and both sidewalls 315b disposed on both ends of the bottom surface 315a. Thus, a step S may exist between the bottom surface 315a of the trench 315 and the first surface 300a of the base substrate 300. The trench 315 may be formed to have a preset depth D3.

Figure 10:
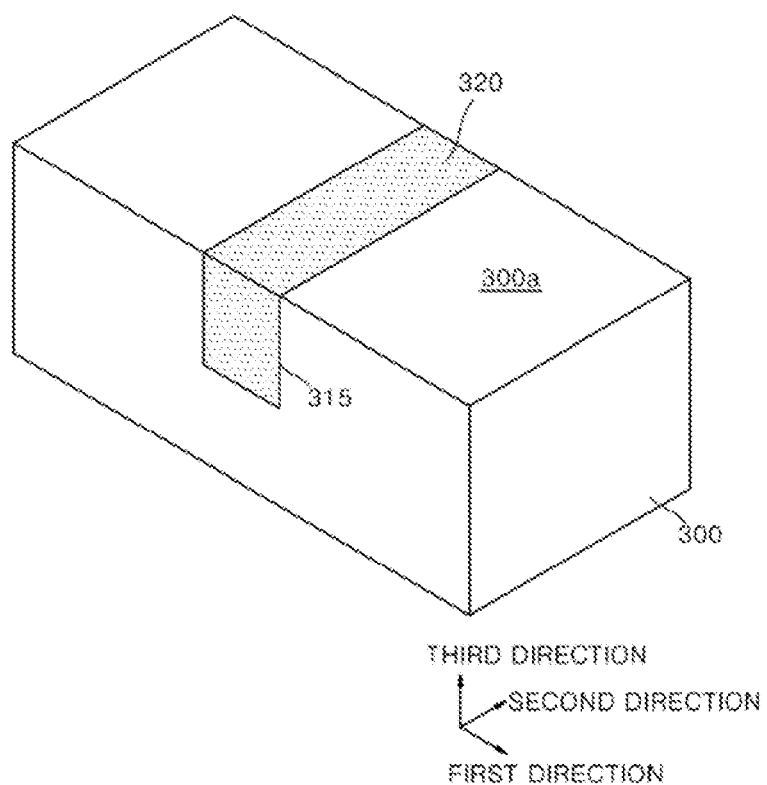

Referring to FIG. 10, a blocking layer 320 may be formed in the base substrate 300. The blocking layer 320 may be formed by filling the trench 315. For example, an insulation layer may be formed on the first surface 300a of the base substrate 300 to fill the trench 315. The insulation layer for filling the trench 315 may be an oxide layer. Subsequently, the insulation layer may be planarized to expose the first surface 300a of the base substrate 300. As a result, the blocking layer 320 may be formed in the trench 315. The insulation layer may be planarized using a chemical mechanical polishing (CMP) process. Since the blocking layer 320 is formed to fill the trench 315, the shape of the blocking layer 320 may depend on a shape of the trench 315.

Thus, the blocking layer 320 may be formed to have an elongated rectangular or linear shape extending in the second direction. The hard mask pattern 305 may be removed before the blocking layer 320 is formed or after the blocking layer 320 is formed. If the hard mask pattern 305 is removed after the blocking layer 320 is formed, the blocking layer 320 may be formed to include a protrusion that protrudes from the first surface 300a of the base substrate 300 (see the embodiment illustrated in FIG. 6).

Figure 11:
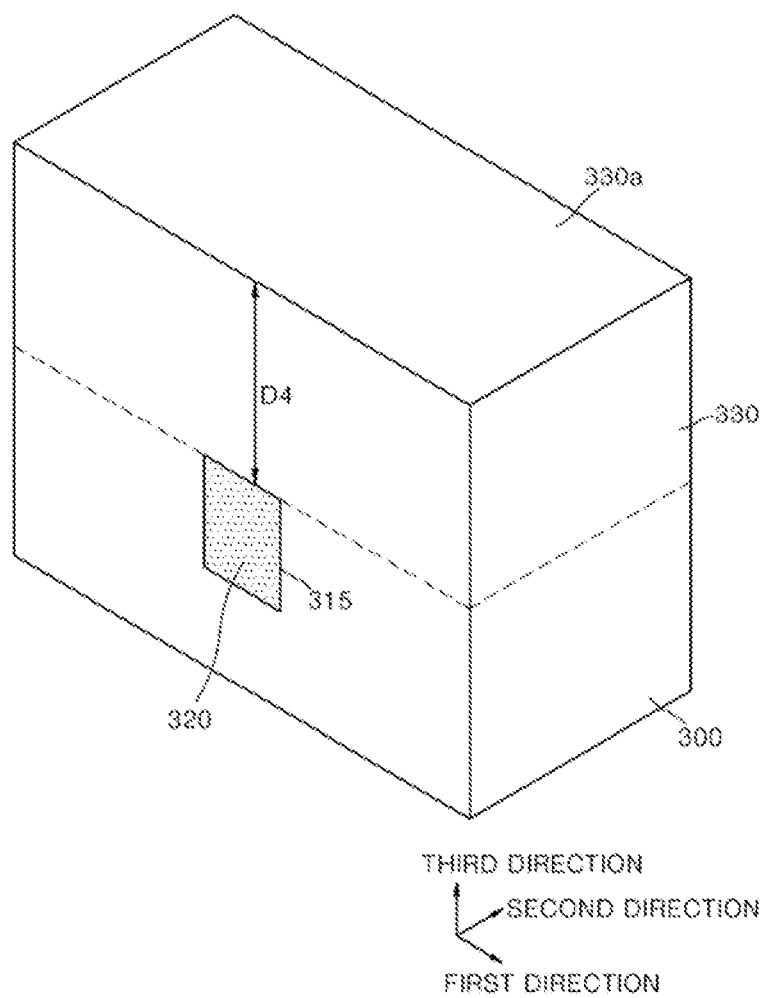

Referring to FIG. 11, a semiconductor layer 330 may be formed on the base substrate 300 and the blocking layer 320. The semiconductor layer 330 may be formed on the first surface (300a of FIG. 10) of the base substrate 300. Accordingly, the base substrate 300 and the blocking layer 320 may be covered with the semiconductor layer 330. The semiconductor layer 330 may be formed of a silicon material. The semiconductor layer 330 may be formed by growing an epitaxial layer on the first surface 300a of the 10o base substrate 300, by bonding a semiconductor layer to the base substrate 300, or by depositing a semiconductor layer on the first surface 300a of the base substrate 300. The semiconductor layer 330 may be patterned in a subsequent process to form a fin-shaped active region. Thus, the semiconductor layer 330 may be formed to have a thickness which is equal to or greater than a height of the fin-shaped active region to be formed in a subsequent process. The blocking layer 320 may be disposed to be spaced apart from a top surface 330a of the semiconductor layer 330 by a preset depth D4. The preset depth D4 may correspond to a thickness of the semiconductor layer 330.

Figure 12:
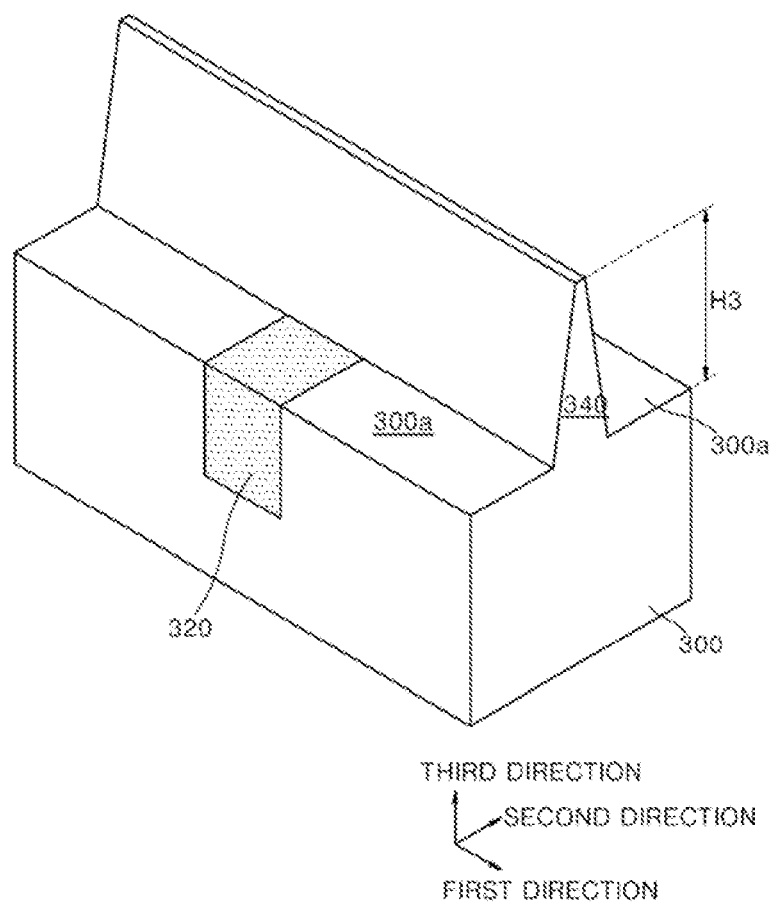

Referring to FIG. 12, the semiconductor layer 330 may be patterned using an etch process to form a fin-shaped active region 340. For example, a mask pattern (not shown) may be formed on a portion of the semiconductor layer 330. Subsequently, the semiconductor layer 330 may be etched using the mask pattern as an etch mask, thereby forming the fin-shaped active region 340 that vertically protrudes from the base substrate 300. After the fin-shaped active region 340 is formed, the mask pattern may be removed. The fin-shaped active region 340 may protrude in a third direction perpendicular to the first and second directions. The fin-shaped active region 340 may be formed to protrude from the first surface 300a of the base substrate 300 by a preset height H3. The preset height H3 of the fin-shaped active region 340 may be determined depending on a channel width of a finFET. The fin-shaped active region 340 may be formed to have an elongated or linear shape extending in the first direction. The etch process for forming the fin-shaped active region 340 may be performed using the blocking layer 320 as an etch stop layer.

The fin-shaped active region 340 may have a width in the second direction. In such a case, the fin-shaped active region 340 may be formed so that a lower width of the fin-shaped active region 340 may be greater than an upper width of the fin-shaped active region 340. For example, a width of the fin-shaped active region 340 may gradually increase toward the base substrate 300. Accordingly, a vertical cross-sectional view of the fin-shaped active region 340 taken along the second direction may have a trapezoid shape. Since the fin-shaped active region 340 is formed to extend in the first direction, the fin-shaped active region 340 may intersect the blocking layer 320 extending in the second direction when viewed from a plan view.

Figure 13:
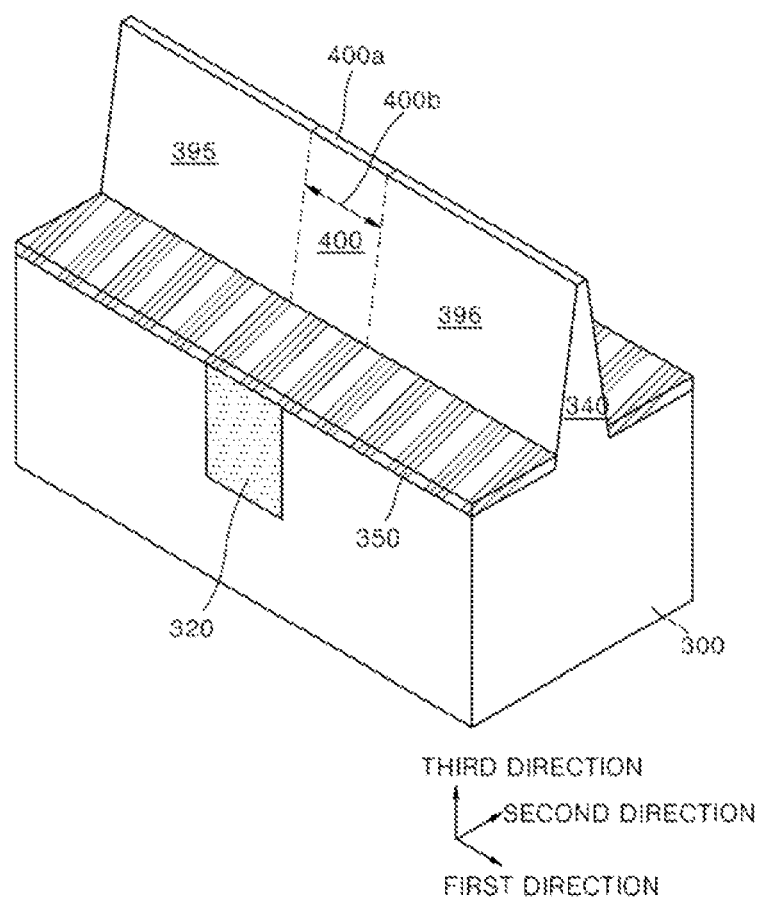

Referring to FIG. 13, a passivation layer 350 may be formed on the blocking layer 320. The passivation layer 350 may be formed to include an Insulation layer, for example, an oxide layer. The passivation layer 350 may be formed at both sides of the fin-shaped active region 340. The passive layer 350 may be formed to cover the first surface 300a of the base substrate 300 other than the area covered by the base area of the fin-shaped active region. The passivation layer 350 may also be formed to cover lower portions of the sidewalls of the fin-shaped active region 340.

Subsequently, impurity regions may be formed in the fin-shaped active region 340. The impurity regions may be formed by implanting P-type ion impurities or N-type ion impurities into the fin-shaped active region 340. The impurity regions may include a first impurity region 395 and a second impurity region 396, are spaced apart from each other by an intermediate region 400. The intermediate region 400 of the fin-shaped active region 340 between the first and second impurity regions 395 and 396 may define a channel region 400. The channel region 400 may overlap with a portion of the blocking layer 320. The channel region 400 comprises a top surface 400a and both side walls 400b.

Figure 14:
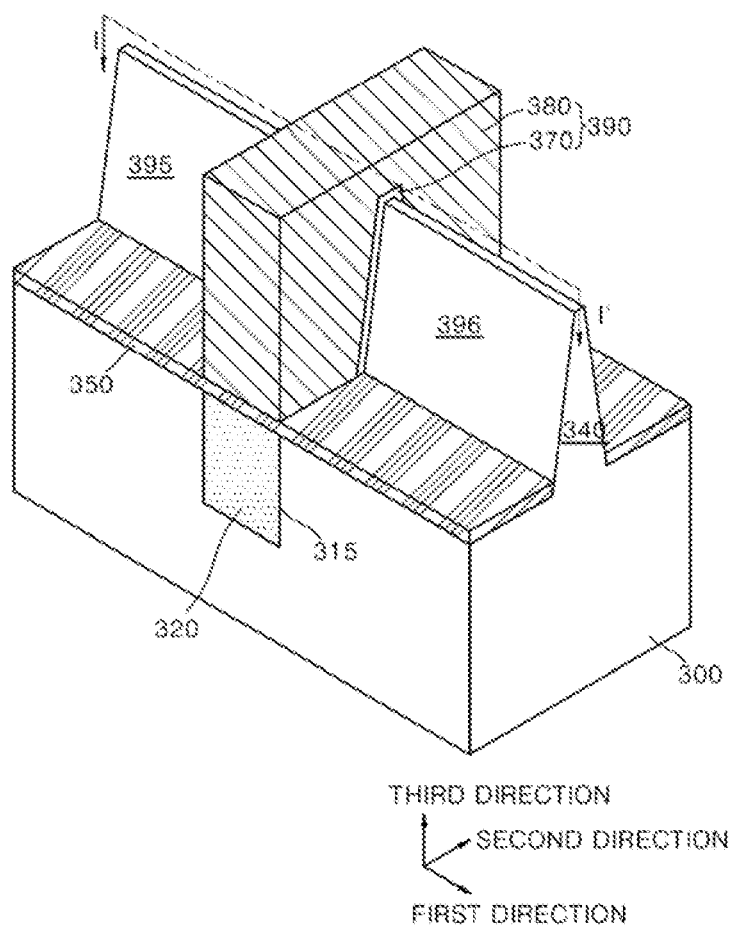
Figure 15:
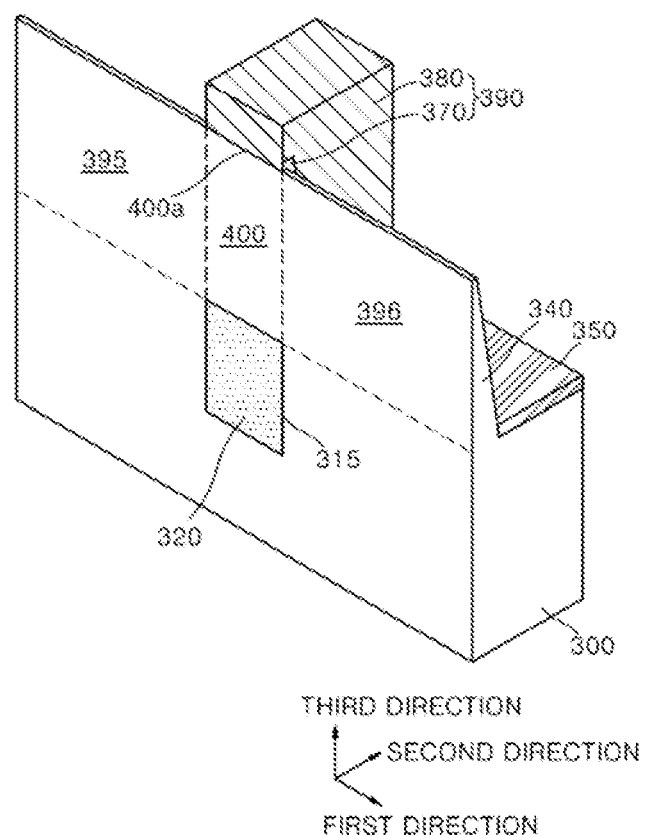

Referring to FIGS. 14 and 15, a gate 390 may be formed on the fin-shaped active region 340. The gate may be formed to have an arch shape surrounding the top surface 400a (refer to FIG. 13) and both side walls 400b (refer to FIG. 13) of the channel region 400. The gate 390 may be formed to overlap with the blocking layer 320. For example, the gate 390 may be formed to extend in the second direction. Accordingly, the gate 390 may overlap with the blocking layer 320 and the channel region 400 and may cross over the fin-shaped active region 340. The gate 390 may be formed to include a gate electrode 380 and a gate insulation layer 370 disposed between the gate electrode 380 and the fin-shaped active region 340.

The embodiments of the present disclosure have been disclosed above for illustrative purposes. Those of ordinary skill in the art will appreciate that various modifications, additions, and substitutions are possible, without departing from the scope and spirit of the present invention as disclosed in the accompanying claims.

For example, while in the various described embodiments a silicon base material is used, it should be understood that many other semiconductor materials may also be used. Likewise, the invention is not limited to the described materials used for the various parts and layers of the semiconductor device and for the method of making it. It should be understood that any other suitable materials may be used including but not limited only to materials already well known to those skilled in the relevant art.

What is claimed is:

1. A semiconductor device comprising:
   a fin-shaped active region protruding from a surface of a base substrate, the fin-shaped active region including a first impurity region and a second impurity region spaced apart from each other along a first direction and a channel region disposed between the first and second impurity regions;
   a trench provided in the base substrate under the channel region, the trench extending in a second direction to intersect the fin-shaped active region in a plan view;
   a blocking layer for filling the trench, disposed to overlap with the channel region of the fin-shaped active region; and
   a gate disposed to overlap with blocking layer and the channel region.

2. The semiconductor device of claim 1, wherein the fin-shaped active region and the base substrate are formed as a single unified body.

3. The semiconductor device of claim 1, wherein a lower width of the fin-shaped active region is greater than an upper width of the fin-shaped active region.

4. The semiconductor device of claim 1, wherein the first and second impurity regions are disposed in two separate regions of the fin-shaped active region which are located at both sides of the gate, respectively.

5. The semiconductor device of claim 1, wherein the first and second impurity regions act as a source region and a drain region, respectively.

6. The semiconductor device of claim 1,
wherein the trench is defined by a bottom surface located at a lower level than the surface of the base substrate and both sidewalls disposed on both ends of the bottom surface; and
wherein a step exists between the bottom surface of the trench and the surface of the base substrate.

7. The semiconductor device of claim 1, wherein the blocking layer overlaps with the channel region of the fin-shaped active region and has an elongated shape extending in the second direction.

8. The semiconductor device of claim 7, wherein the blocking layer is or includes an oxide layer.

9. The semiconductor device of claim 1, wherein a ratio of a horizontal width of the blocking layer to a vertical thickness of the blocking layer is greater than 1 for preventing flow of a channel leakage current between the first impurity region and the second impurity region.

10. The semiconductor device of claim 1, wherein a top surface of the blocking layer is substantially coplanar with the surface of the base substrate.

11. The semiconductor device of claim 1, wherein the blocking layer protrudes from the surface of the base substrate to have a top surface located at a level higher than the base area of the fin-shaped active region.

12. The semiconductor device of claim 1,
wherein the second direction is perpendicular to the first direction.

13. The semiconductor device of claim 1, further comprising a passivation layer disposed between the gate and the blocking layer,
the passivation layer extending onto the surface of the base substrate.

14. The semiconductor device of claim 13, wherein the passivation layer is comprised of an insulation layer including an oxide material.

15. The semiconductor device of claim 1, wherein the gate surrounds a top surface and both sidewalls of the channel region of the fin-shaped active region.

16. A method of fabricating a semiconductor device, the method comprising:
forming a trench in a base substrate, the trench extending in one direction along a surface of the base substrate;
filling the trench with an insulation layer to form a blocking layer in the trench;
forming a semiconductor layer on the blocking layer and the base substrate;
patterning the semiconductor layer to form a fin-shaped active region that protrudes from the surface of the base substrate and intersects the blocking layer to overlap with a portion of the blocking layer;
forming a first impurity region and a second impurity region spaced apart from each other in the fin-shaped active region to define a channel region between the first and second impurity regions; and
forming a gate that overlaps with the blocking layer and the channel region and intersects the fin-shaped active region.

17. The method of claim 16, wherein the blocking layer is formed so that a ratio of a horizontal width of the blocking layer to a vertical thickness of the blocking layer is greater than one.

18. The method of claim 16, wherein the blocking layer is formed to have a top surface which is substantially coplanar with the surface of the base substrate.

19. The method of claim 16, wherein the blocking layer is formed to protrude from the surface of the base substrate so that a top surface of the blocking layer is located at a level higher than bottom surfaces of the first and second impurity regions.

20. The method of claim 16, further comprising forming a passivation layer on the base substrate and the blocking layer before the first and second impurity regions are formed.

* * * * *